United States Patent [19]

Hallgren et al.

[11] Patent Number: 5,108,842
[45] Date of Patent: Apr. 28, 1992

[54] CURABLE DIELECTRIC POLYPHENYLENE ETHER-POLYEPOXIDE COMPOSITIONS USEFUL IN PRINTED CIRCUIT BOARD PRODUCTION

[75] Inventors: John E. Hallgren, Scotia; Victoria J. Eddy, Schenectady, both of N.Y.; James E. Tracy, Glenford, Ohio

[73] Assignee: General Electric Company, Schenectady, N.Y.

[21] Appl. No.: 702,473

[22] Filed: May 20, 1991

Related U.S. Application Data

[62] Division of Ser. No. 288,214, Dec. 22, 1988, Pat. No. 5,043,367.

[51] Int. Cl.⁵ .................... B32B 15/08; B32B 27/38
[52] U.S. Cl. .......................... 428/416; 428/289; 428/413; 428/415; 428/457; 428/542.8; 428/901
[58] Field of Search ............... 428/289, 413, 415, 457, 428/901, 542.8, 416

[56] References Cited

U.S. PATENT DOCUMENTS 3,812,214  5/1974  Markovitz .
4,853,423  8/1989  Walles et al. .

FOREIGN PATENT DOCUMENTS 5869052 10/1988 Japan .

Primary Examiner—Jacob Ziegler
Attorney, Agent, or Firm—William H. Pittman; James C. Davis, Jr.

[57] ABSTRACT

Curable compositions containing a polyphenylene ether and a polyepoxide composition containing brominated and non-brominated bisphenol polyglycidyl ethers, in combination with further components including specific catalysts and hardeners, may be used in the preparation of laminates useful as printed circuit boards and bonding sheets therefor and having excellent physical and electrical properties.

20 Claims, No Drawings

CURABLE DIELECTRIC POLYPHENYLENE ETHER-POLYEPOXIDE COMPOSITIONS USEFUL IN PRINTED CIRCUIT BOARD PRODUCTION

This application is a division of application Ser. No. 07/288,214, filed Dec. 22, 1988 now U.S. Pat. No. 5,043,367.

This invention relates to resinous compositions useful as dielectics, and more particularly to polyphenylene ether-polyepoxide compositions suitable for fabrication into printed circuit boards.

A number of polyphenylene ether-polyepoxide compositions having favorable dielectric properties, and supposedly being useful in circuit board manufacture, are known. However, for the most part these have not attained wide commercial use because of deficiencies in one or more properties. Thus, while the polyphenylene ethers are excellent dielectrics and the properties of combinations thereof with polyepoxides are favorable in this respect, they lack solvent resistance which is required in order for the circuit board to survive cleaning. Other deficiencies are found in areas such as flammability, solderability and resistance to high temperatures. Moreover, times required for curing such compositions are typically too long for effective manufacture of circuit boards in large volume.

In addition to excellent dielectric properties, resinous compositions to be used for printed circuit board manufacture should be highly lame-retardant. A V-1 rating, as determined by Underwriters Laboratories test procedure UL-94, is universally required with V-O usually being necessary. The V-O rating requires a flame-out time (FOT) of not more than 10 seconds in any trial and a cumulative FOT of not more than 50 seconds for five samples. As a practical matter, a maximum cumulative FOT of 35 seconds is often mandated by purchasers.

The fabricated board should not lose substantial weight and its surface should not be appreciably marred by contact with methylene chloride, a solvent commonly used for cleaning. Since conductive connections with the printed circuit are typically made by soldering, the board must be solder-resistant as evidenced by the lowest possible percent increase in thickness (Z-axis expansion) when exposed to liquid solder at 288° C. In addition to all these properties of the cured material, a relatively short curing time is highly desirable.

In Japanese Kokai 58/69052, combinations of polyphenylene ethers with various types of polyepoxides are disclosed. The latter include epoxy novolak resins and polyglycidyl ethers of such compounds as bisphenol A and 2,2-bis-(3,5-dibromo-4-hydroxyphenyl)propane (tetrabromobishphenol A). Curing of these compositions is achieved by contact with various known curing agents, including amines. The cured compositions, however, have been found to be seriously deficient in solvent resistance and, in certain cases, in solderability.

Copending, commonly owned application Ser. No. 219,016 filed Jul. 14, 1988, now U.S. Pat. No. 4,853,423, discloses curable polyphenylene ether-polyepoxide compositions incorporating partially cured ("upstaged") products prepared from halogen-free bisphenol polyglycidyl ethers, halogen-free epoxidized novolaks and bisphenols containing bromine as aryl substituents, and cured materials prepared therefrom and having utility for laminate and circuit board production. These compositions generally have the aforementioned desirable properties. However, there is room for improvement in the areas of flow rate and degree of fiber saturation. Moreover, fluctuations in degree of solderability are sometimes observed. This latter condition appears to be the result, at least in part, of the necessary incorporation of antimony pentoxide in the composition as a flame retardancy synergist, more particularly in combination with a dispersing agent as described hereinafter.

In addition, curable compositions suitable for bonding sheet fabrication are needed. Bonding sheets are employed when a multilayer structure is desired, involving etching of numerous printed circuits followed by their lamination into a single unit. For this purpose, a fiber-reinforced resinous bonding sheet is employed to separate the etched copper circuitry on two successive circuit boards, with the desired connections being made through the bonding sheet.

The bonding sheet composition must generally have a substantially higher flow rate when melted under low pressure than a composition employed in circuit board manufacture. It must also have a relatively high resin loading, since the resin must completely fill the voids created during the etching of circuits in the printed circuit boards. Extended cure time is also necessary, in order that the required flow may be achieved before curing is initiated. The formulation must be compatible with the base material in the circuit board. Finally, flexibility is preferred in a bonding sheet, unlike laminates for circuit boards in which stiffness is required.

The present invention provides a series of resinous compositions which comprise polyepoxides, polyphenylene ethers and various catalysts, flame retardants and other constituents. When used to impregnate suitable fibrous reinforcing materials such as glass fiber cloth, they furnish workable prepregs. (As used herein, "prepreg" means a curable article comprising a substrate impregnated with an uncured or partially cured resinous material.) Said compositions are readily soluble in organic solvents, facilitating impregnation. The cured materials prepared therefrom are solder resistant, solvent resistant and flame retardant, and have excellent dielectric properties and dimensional stability at high temperatures. Therefore, said cured materials are excellent when employed as laminates and bonding sheets for printed circuit boards.

In one of its aspects, the invention includes curable compositions containing at least about 5% chemically combined bromine and comprising:

(I) about 40–65% of at least one polypheylene ether;

(II) about 30–55% of a polyepoxide composition comprising at least one bisphenol polyglycidyl ether having an average of at most one aliphatic hydroxy group per molecule, said composition containing about 10–30% bromine as aryl substituents;

(III) a catalytic ally effective amount of at least one of imidazoles and arylene polyamines; and (IV) a cocatalytically effective amount of zinc or aluminum in the form of a salt which is soluble or stably dispersible in said curable composition;

said composition being dissolved in an effective amount of an inert organic solvent;

all percentages being by weight and based on the total of components I and II.

The polyphenylene ethers useful as component I in the compositions of this invention comprise a plurality of structural units having the formula

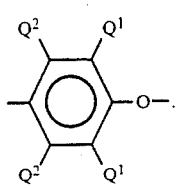
(I)

In each of said units independently, each $Q^1$ is independently halogen, primary or secondary lower alkyl (i.e., alkyl containing up to 7 carbon atoms), phenyl, haloalkyl, aminoalkyl, hydrocarbonoxy, or halohydrocarbonoxy wherein at least two carbon atoms separate the halogen and oxygen atoms; and each $Q^2$ is independently hydrogen, halogen, primary or secondary lower alkyl, phenyl, haloalkyl, hydrocarbonoxy or halohydrocarbonoxy as defined for $Q^1$. Examples of suitable primary lower alkyl groups are methyl, ethyl, n-propyl, n-butyl, isobutyl, n-amyl, isoamyl, 2-methylbutyl, n-hexyl, 2,3-dimenthybutyl, 2-, 3- or 4-methylpentyl and the corresponding heptyl groups. Examples of secondary lower alkyl groups are isopropyl, sec-butyl and 3-pentyl. Preferably, any alkyl radicals are straight chain rather than branched. Most often, each $Q^1$ is alkyl or phenyl, especially $C_{1-4}$ alkyl, and each $Q^2$ is hydrogen.

Both homopolymer and copolymer polyphenylene ethers are included. Suitable homopolymers are those containing, for example, 2,6-dimethyl-1,4-phenylene ether units. Suitable copolymers include random copolymers containing such units in combination with (for example) 2,3,6-trimethyl-1,4-phenylene ether units. Many suitable random copolymers, as well as homopolymers, are disclosed in the patent literature.

Also included are polyphenylene ethers containing moieties which modify properties such as molecular weight, melt viscosity and/or impact strength. Such polymers are described in the patent literature and may be prepared by grafting onto the polyphenylene ether in known manner such non-hydroxy-containing vinyl monomers as acrylonitrile and vinylarmomatic compounds (e.g., styrene), or such non-hydroxy-containing polymers as polystyrenes and elastomers. The product typically contains both grafted and ungrafted moieties. Other suitable polymers are the coupled polyphenylene ethers in which the coupling agent is reacted in known manner with the hydroxy groups of two polyphenylene ether chains to produce a higher molecular weight polymer containing the reaction product of the hydroxy groups and the coupling agent. Illustrative coupling agents are low molecular weight polycarbonates, quinones, heterocycles and formals.

For the purposes of this invention, the polyphenylene ether has a number average molecular weight within the range of about 3,000–40,000, preferably at least about 12,000 and most preferably at least about 15,000, and a weight average molecular weight within the range of about 20,000–80,000, as determined by gel permeation chromatography. Its intrinsic viscosity is most often in the range of about 0.35–0.6 dl./g., as measured in chloroform at 25° C.

The polyphenylene ethers are typically prepared by the known oxidative coupling of at least one corresponding monohydroxyaromatic compound. Particularly useful and readily available momohydroxyarmomatic compounds ar 2,6-xylenol (wherein each $Q^1$ and one $Q^2$ is methyl and the other $Q^2$ is hygrogen), whereupon the polymer may be characterized as a poly(2,6-dimethyl-1,4-phenylene ether), and 2,3,6-trimethylphenol (wherein each $Q^1$ and one $Q^2$ are methyl and the other $Q^2$ is hydrogen).

Particularly useful polyphenylene ethers for the purposes of this invention are those which comprise molecules having aminoalkyl-substituted end groups, as described in numerous patents and publications. Such molecules frequently constitute a substantial proportion of the polyphenylene ether, typically as much as about 90% by weight. Polymers of this type may be obtained by incorporating an appropriate primary or secondary monoamine as one of the constituents of the oxidative coupling reaction mixture.

It will be apparent to those skilled in the art from the foregoing that the polyphenylene ethers contemplated for use in the present invention all those presently known, irrespective of variations in structural units or ancillary chemical features.

Component II is a polyepoxide composition comprising at least one bisphenol polyglycidyl ether. It usually comprises a mixture of such ethers, part of the components of said mixture being halogen-free and the balance thereof containing bromine as aryl substitutents. The total amount of bromine therein is about 10-30% by weight.

Compounds of this type are prepared conventionally by the reaction of bisphenols with epichlorohydrin. (By "bisphenol" as used herein is meant a compound containing two hydroxyphenyl groups attached to an aliphatic of cycloaliphatic moiety, which may also contain aromatic substituents.) Said compounds may be represented by the formula

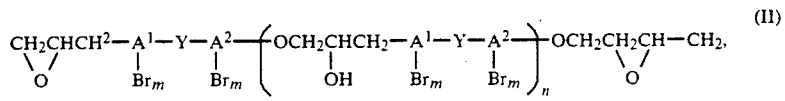
(II)

wherein m is 0-4, n has an average value up to 1, each of $A^1$ and $A^2$ is a monocyclic divalent aromatic radical and Y is a bridging radical in which one or two atoms separate $A^1$ from $A^2$. The O-$A^1$ and $A^2$-O bonds in formula II are usually in the meta or para positions of $A^1$ and $A^2$ in relation to Y.

In formula II, the $A^1$ and $A^2$ values may be unsubstituted phenylene or substituted derivatives therof, illustrative substituents (one or more) being alkyl, nitro, alkoxy and the like. Unsubstituted phenylene radicals are preferred. Each of $A^1$ and $A^2$ may, 1 for example, be o- or m-phenylene and the other p-phenylene, but both are preferably p-phenylene.

The bridging radical, Y, is one in which one or two atoms, preferably one, separate $A^1$ from $A^2$. It is most often a hydrocarbon radical and particularly a saturated radical such a methylene, cyclohexylmethylene, ethylene, isopropylidene, neopentylidene, cyclohexylidene or cyclopentadecylidene, especially a gem-alkylene (alkylidene) radical and most preferably isopropylidene. Also included, however, are radicals which contain atoms other than carbon and hydrogen; for example, carbonyl, oxy, thio, sulfoxy and sulfone.

In most instances, component II comprises at least two bisphenol polyglycidyl ethers, one being brominated (m is 1-4, preferably 2) and the other bromine-free (m is 0). The proportions thereof are based on the required bromine content for component II of about 10-30%. The preferred materials are commercially available reaction products of epichlorohydrin and 2,2-bis(4-hydroxyphenyl)propane (bisphenol A), including EPON 825 (=0) and EPON 828 (n=about 0.14), available from Shell Chemical Co., and similar products prepared from epichlorohydrin and tetrabromobisphenol A. The principal purpose of the brominated compounds is to provide flame retardancy.

Component III is at least one compound selected from me group consisting of imidazoles and arylene polyamines. Any of such imidazoles and polyamides known in the art to be useful as curing agents for epoxy resins may be employed. Particularly useful imidazoles are imidazole, 1,2-dimethylimidazole, 2-methylimidazole, 2-heptadecylimidazole and 1-(2-cyanoethyl)-2phenylimidazole. Commercially available imidazole-arylene polyamide mixtures are often preferred; the especially preferred mixtures contain arylene polyamides with a high degree of alkyl substitution on the aromatic ring, typically at least 3 such substituents. The diethylmethyl-substituted m- and p-phenylenediamines are generally the most preferred polyamides.

The amount of component III is a catalytically effective amount to achieve curing, preferably rapidly after solvent removal. Most often, it is at least 4.5 and preferably at least 10 milliequivalents of basic nitrogen per 100 parts of total curable composition, including any basic nitrogen present in polyphenylene ether (mostly as aminoalkyl-substituted end groups). Thus, when a polyphenylene ether essentially free from basic nitrogen is employed the proportion of component III must be increased. (For the purpose of this invention, the equivalent weight of an imidazole is equal to its molecular weight and that of a diamine if half its molecular weight.)

Component IV is chemically combined zinc or aluminum, preferably zinc, furnished in the form of a salt which is soluble or stably dispersible in the curable composition. Salts of diketones in which one carbon atom separates the carbonyl groups, especially acetylacetonates, and salts of fatty acids, especially stearates, are examples of suitable forms of zinc or aluminum for this purpose. In general, the fatty acid salts are preferred when component III contains alkylene polyamides, and diketone salts are preferred when component III is entirely imidazole.

Under certain conditions, acetylacetonates such as zinc acetylacetone can form hydrates which readily lose acetylacetone and become insoluble in the organic systems used for laminate preparation. Therefore, it may be necessary to make steps to maintain the zinc or aluminum in stable dispersion.

One means for doing this is to subject the composition to continuous agitation; however, this is generally not practical. A better method is to form an alcoholate of the acetylacetonate, as by reaction with methanol. Said alcoholate loses alcohol rather than acetylacetone under similar conditions, remaining in solution of homogeneous suspension.

Another method for maximizing homogeneity is to employ a fatty acid salt. Still another method is to employ a titanium compound as a compatibilizer, as disclosed hereinafter.

Component IV is employed in a cocatalytically effective amount, and generally also serves to improve solvent resistance and flame retardancy. About 0.1-1.0% of zinc or aluminum, based on total curable composition, is usually present.

Various other materials may be employed in the curable compositions of this invention; the presence of certain of them is usually preferred. One of these is (V) at least one epoxidized novolak, most often halogen-free. It is usually employed in the amount of about 5-10 parts by weight per 100 parts of total components I and II.

Suitable novolaks for use as precursors for component V are known in the art and are typically prepared by the reaction of formaldehyde with a hydroxyaromatic compound such as phenol (which is often preferred), cresol or t-butylphenol. The novolak then undergoes reaction with an epoxy reagent such as epichlorohydrin to produce the resin useful as component V.

Various epoxidized novolaks are commercially available, and any of them may be used according to the invention. It is usually strongly preferred that the epoxidized novolak contain substantially no free phenolic hydrogen atoms.

Another material which is often preferred is (VI) at least one novolak, substantially all oxygen therein being in the form of phenolic hydroxy groups. It is also usually halogen-free. It serves as a hardener and accelerates curing, particularly in compositions to be used for circuit boards as opposed to bonding sheets. It is similar in molecular structure to the previously described epoxidized novolak except that it has not bee epoxidized. t-Butylphenolformaldehyde novolaks are often preferred. The amount of said novolak is generally abut 10-15 parts by weight per 100 parts of total components I and II.

The curable compositions of the invention are dissolved in an effective amount of an inert organic solvent, typically to a solute content of about 30-60% by weight. The identity of the solvent is not critical, provided it may be removed by suitable means such as evaporation. Aromatic hydrocarbons, especially toluene, are preferred. The order of blending and dissolution is also not critical; however, in order to avoid premature curing, catalyst and hardener components should generally not be brought initially into contact with polyphenylene ether and polyepoxides at a temperature above about 60° C. Proportions of components and bromine herein do not include solvent.

The broad ranges of proportions and the preferred proportions of bromine and the various components in the curable compositions of the invention which contain components V and VI, based on total curable composition (excluding solvent), are:

|  | Broad | Preferred |
| --- | --- | --- |
| Bromine | At least about 5% | About 5-20% |
| Component I | About 35-55% | About 35-45% |
| Component II | About 20-60% | About 25-45% |
| Component III | At least 4.5 meq. basic N (total) | About 15-30 meq. basic N (total) |
| Component IV | About 0.1-1.0% Zn or Al | About 0.1-0.6% Zn or Al |
| Component V | About 3-10% | About 5-10% |
| Component VI | About 4-15% | About 8-12% |

Among the other materials which may be present are inert, particulate fillers such as talc, clay, mica, silica, alumina and calcium carbonate. In addition, the bromine content of the curable composition may be supplied in part by materials such as alkyl tetrabromophthalates and/or epichlorohydrin reaction products with mixtures of bishphenol A and tetrabromobisphenol A. The alkyl tetrabromophthalates also serve as plasticizers and flow improvers. Fabric wettability enhancers, chiefly polar liquids such as n-butyl alcohol, methyl ethyl ketone and tetrahydrofuran, may be advantageous under certain conditions. Such materials as antioxidants, thermal and ultraviolet stabilizers, lubricants, antistatic agents, dyes and pigments may also be present.

An important feature of the invention is the fact that flame retardancy synergists, such as antimony pentoxide, are generally not necessary. However, they may be incorporated when appropriate.

When antimony pentoxide is employed, it must be maintained in stable dispersion. This may be done by agitation and/or combination with a suitable dispersing agent, of which many are known in the art. The proportion of antimony pentoxide is usually up to about 4 parts per 100 parts of components I–VI.

One preferred dispersing agent is a polymer which is compatible with the resinous constituents of the curable composition but is substantially non-reactive under the conditions employed, typically a polyester. More powerful dispersing agents, such as amines, may be required when component IV is a fatty acid salt, since such salts may otherwise form insoluble complexes with antimony pentoxide.

A material whose presence in minor amount may improve the solvent resistance and compatibility of the curable composition, and is therefore preferred, is at least one aliphatic tri(dialkylphosphato)titanate. Suitable phosphatotitananates are known in the art and commercially available. They may be represented by the formula

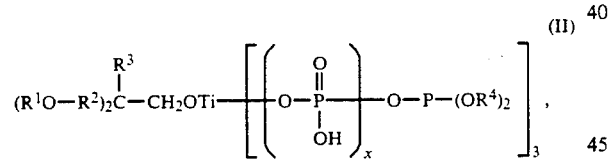

(II)

wherein $R^1$ is $C_{2-6}$ primary or secondary alkyl or alkenyl and preferably alkenyl, $R^2$ is $C_{1-3}$ alkylene and preferably methylene, $R^3$ is $C_{1-5}$ primary or secondary alkyl and x is from 0 to about 3 and is preferably 0 or 1. Most preferably, $R^1$ is allyl, $R^3$ is ethyl, $R^4$ is octyl and x is 0. The phosphatotitanate is most often present in the amount of about 0.1–1.0 part by weight per 100 parts of the resinous composition.

The present invention includes all compositions which comprise the above-described constituents, including those containing other unspecified ingredients. However, the compositions which are often preferred consist essentially of components I–VI; that is, said components are the only ones which materially affect that basic and novel characteristics of the compositions.

Another aspect of the invention is prepregs comprising a fibrous substrate (woven or non-woven) such as glass, quartz, polyester, polyamide, polypropylene, cellulose, nylon or acrylic fibers, preferably glass, impregnated with the curable composition and obtained upon removal of the solvent therefrom by evaporation or the like. Such prepregs may be cured by application of heat and pressure. The resulting cured articles are other aspects of the invention.

Typically, 2- or 20-ply laminates are compression molded at temperatures in the range of about 200°–250° C. and under pressures on the order of 20–60 kg./cm.$^2$. Laminates clad with a conductive metal such as copper, useful for printed circuit board production, may be so prepared and cured by art-recognized methods. As previously mentioned, printed circuit board blanks comprising said laminates are characterized by excellent dielectric properties, solderability, flame retardancy and resistance to high temperature conditions and solvents. The metal cladding may then be conventionally patterned.

The preparation of the curable compositions, cured compositions and laminates of this invention is illustrated by the following examples. All parts and percentages are by weight unless otherwise indicated.

In the examples, the following materials were employed:

Component I—a poly(2,6-dimethyl-1,4-phenylene ether) having a number average molecular weight of about 20,000, an intrinsic viscosity in chloroform at 25° C. of 0.40 dl./g. and a nitrogen content of about 960 ppm.

Component II—a mixture of bisphenol A diglyicdyl ether and the diglycidyl ether of tetrabromobisphenol A.

Component III—a mixture of 1,2-dimethylimidazole and isomers of diethylmethylphenylenediamine, having an average equivalent weight of about 91.

Component IV—zince acetylacetonate or zinc stearate.

Component V—an epoxy nololak resin commercially available from Ciba-Geigy under the grade designation "EPN 1138".

Component VI—a commercially available t-butylphenol novolak having an average molecular weight in the range of about 700–900.

Phosphatiotitanate—a commercially available compound of formula VII wherein $R^1$ is allyl, $R^2$ is methylene, $R^3$ is ethyl, $R^4$ is octyl and x is 0.

ADP—480—a commercially available colloidal dispersion comprising about 75% antimony pentoxide coated with an amine powder and dispersed in toluene.

EXAMPLE 1

A curable composition was prepared by dissolution of the following ingredients in the indicated amounts in toluene to a total solids concentration of 30%.

Component I—50.81%
Component II: Non-brominated—15.25%; brominated—15.24%
Component III—1.42%
Component IV—zinc acetylacetonated, 2.03%
Component V—5.08%
Component VI—10.16%
Phosphatotitanate—0.50 part per 100 parts of components V–VI. Glass cloth was dipped into the toluene solution and the resulting prepreg was dried in a forced air tower at 165° C. A laminate was then prepared from 8 plies of the prepreg by compression molding for 10 minutes at 235° C. Prior to molding, the prepreg exhibited no dusting. The cured product exhibited essentially no Z-axis expansion and had good solvent resistance.

EXAMPLES 2-3

Two compositions were prepared in toluene solution as described in Example 1, using a 92:8 (by weight) toluenetetrahydrofuran mixture. Four plies of glass fiber cloth were stacked and the stacks were immersed in the solutions to form prepregs which were dried in a forced air oven at 173°-175° C. for 10 minutes, turned over and dried for another 10 minutes. The resulting composite laminates were pressed between sheets of polytetrafluoroethylene-coated aluminum foil at 200° C. and 1.38 MPa. The laminate of Example 3 was evaluated for flame retardancy in accordance with Underwriters Laboratories procedure UL-94, and according to various test procedures which form part of military specification MIL-P-13949. The results for Examples 2-3 are given in Table I.

TABLE I

|  | 2 | 3 |
| --- | --- | --- |
| Component I, % | 39.67 | 37.83 |
| Component II, % |  |  |
| Non-brominated | 9.51 | 9.07 |
| Brominated | 33.42 | 31.86 |
| Component III, % | 0.64 | 1.84 |
| Component IV: Zinc stearate, % | 1.80 | 5.15 |
| Component V, % | 5.78 | 5.51 |
| Component VI, % | 9.17 | 8.74 |
| Phosphatotitanate, parts per 100 parts* | 0.46 | 0.44 |
| Bromine, % | 16.2 | 19.0 |
| Zinc, % | 0.18 | 0.52 |
| Basic nitrogen, meq. per 100 parts* | 13.8 | 27.0 |
| Solids content, % | 43 | 45 |
| Laminate thickness, mm. | — | 0.79 |
| Curing time, min.: |  |  |
| 215° C. | 32 | 8–16 |
| 225° C. | 16 | 4–8 |
| 250° C. | 8 | 2–4 |
| UL-94 rating | V-O | — |
| Water absorption (24 hrs. soak at 23° C.), % | 0.09 | — |
| Dielectric constant at 1 MHz.: |  |  |
| Untreated | 4.0 | — |
| After 24 hrs. in water at 23° C. | 4.1 | — |
| Dissipation factor at 1 MHz.: |  |  |
| Untreated | 0.011 | — |
| After 24 hrs. in water at 23° C. | 0.013 | — |
| Parallel dielectric breakdown strength, kv.: |  |  |
| Short time |  |  |
| Untreated | 77 | — |
| After 48 hrs. in water at 50° C. | 43 | — |
| Step by step |  |  |
| Untreated | 73.5 | — |
| After 48 hrs. in water at 50° C. | 38 | — |
| Peel strength, g./cm. | 1964 | — |
| Methylene chloride resistance: |  |  |
| % absorbed | 6 | — |
| % extracted | 1 | — |
| Appearance after absorption | Good | — |
| Z-axis expansion, % | −0.6 | — |

*Based on components I-VI.

EXAMPLE 4

A composition was prepared in toluene solution. It was similar to the compositions of Examples 2-3 except for the absence of phosphatotitanate and the presence of ADP-480. A seven-ply prepreg laminate was prepared therefrom and cured, substantially as described in Examples 2-3. The proportions and test results are given in Table II.

TABLE II

| Component I | 40.51% |
| --- | --- |
| Component II: |  |
| Brominated | 19.10% |
| Non-brominated | 19.10% |
| Component III | 1.56% |
| Component IV | 4.51% |
| Component V | 5.90% |
| Component VI | 19.10% |
| ADP-480, parts per 100 parts* | 3.47 |
| Bromine | 9.7% |
| Zinc | 0.47% |
| Antimony pentoxide, parts per 100 parts* | 2.60 |
| Basic nitrogen, meq. per 100 parts* | 17 |
| Solids content | 49% |
| Laminate thickness | 1.5 mm. |
| Glass transition temp. | 206° C. |
| UL-94 rating | V-O |
| Water absorption (24 hrs. soak at 23° C.) | 0.06% |
| Dielectric constant at 1 MHz.: |  |
| Untreated | 3.96 |
| After 24 hrs. in water at 23° C. | 4.01 |
| Dissipation factor at 1 MHz.: |  |
| Untreated | 0.011 |
| After 24 hrs. in water at 23° C. | 0.013 |
| Parallel dielectric breakdown strength, step by step: |  |
| Untreated | 83 |
| After 48 hrs. in water at 50° C. | 70 |
| Perpendicular dielectric breakdown strength (untreated), volts/mil | 804 |
| Solderability, sec. to blister (288° C.) | 300+ |
| Flexural strength: |  |
| Longitudinal | 547.4 MPa. |
| Cross-sectional | 372.3 MPa. |
| Flexural modulus: |  |
| Longitudinal | 19.0 GPa. |
| Cross-sectional | 15.7 GPa. |

*Based on components I-VI.

What is claimed is:

1. A curable article comprising a fibrous substrate impregnated with a composition containing at least about 5% chemically combined bromine and comprising:
   (I) about 40-65% of at least on polyphenylene ether;
   (II) about 30-55% of a polyepoxide composition comprising at least one bisphenol polyglycidyl ether having an average of at most one aliphatic hydroxy group per molecule, said composition containing about 10-30% bromine as aryl substituents;
   (III) a catalytically effective amount of at least one of imidazoles and arylene polyamines;
   (IV) a cocatalytically effective amount of zinc or aluminum in the form of a salt which is soluble of stably dispersible in said curable composition;
   all percentages being by weight and based on the total of components I and II.

2. An article according to claim 1 wherein component II comprises compounds having the formula

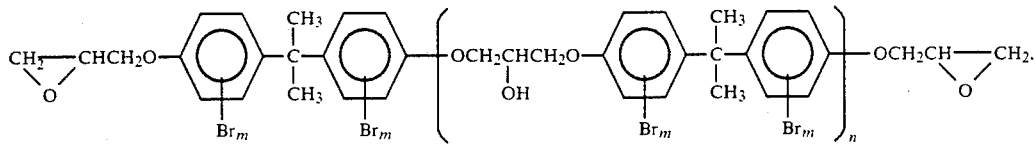

wherein m is 0-4 and n has an average value up to 1.

3. An article according to claim 2 wherein n is 0 and component I is a poly(2,6-dimethyl-1,4phenylene ether) having a number average molecular weight within the range of about 12,000-40,000.

4. An article according to claim 3 wherein component III is at least one imidazole.

5. An article according to claim 3 wherein component III is a mixture of at least one imidazole with at least one arylene polyamine.

6. An article according to claim 3 wherein component IV is zinc acetylacetonate or zinc stearate.

7. An article according to claim 3 wherein said composition also contains at least on aliphatic tris(dialkylphosphato)-titanate of the formula

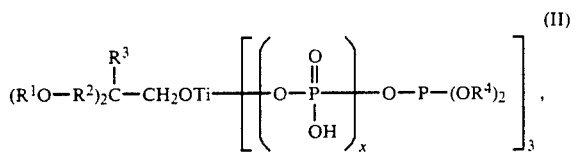

wherein $R^1$ is $C_{2-6}$ primary or secondary alkyl or alkenyl, $R^2$ is $C_{1-3}$ alkylene. $R^3$ is $C_{1-5}$ primary or secondary alkyl, $R^4$ is $C_{5-12}$ primary or secondary alkyl and x is from 0 to about 3, in the amount of about 0.1-1.0 part by weight per 100 parts of the resinous composition.

8. An article according to claim 7 wherein $R^1$ is alkyl, $R^2$ is methylene, $R^3$ is ethyl, $R^4$ is octyl and x is 0 or 1.

9. An article according to claim 3 wherein said composition also contains up to about 4 parts, per 100 parts of components I-IV, of antimony pentoxide stably dispersed therein.

10. A curable article comprising a fibrous substrate impregnated with a composition containing at least about 5% chemically combined bromine and consisting essentially of:

(I) about 35-45% of at least one polyphenylene ether;

(II) about 25-45% of an epoxide composition comprising at least one bisphenol polyglycidyl ether having an average of at most one aliphatic hydroxy group per molecule, said composition containing about 10-30% bromine as aryl substitutents;

(III) an amount of at least one of imidazoles and arylene polyamines to provide about 15-30 milliequivalents of basic nitrogen per 100 parts of said curable composition;

(IV) about 0.1-0.6% of zinc or aluminum in the form of a salt which is soluble or stably dispersible in said curable composition;

(V) about 3-10% of at least on halogen-free epoxidized novolak; and (VI) about 4-15% of at least one halogen-free novolak, substantially all oxygen therein being in the form of phenolic hydroxy groups;

all percentages being by weight and based on the total curable composition.

11. An article according to claim 1 wherein the substrate is glass fiber.

12. An article according to claim 3 wherein the substrate is glass fiber.

13. An article according to claim 10 wherein the substrate is glass fiber.

14. A cured article prepared by the application of heat and pressure to the article of claim 11.

15. A cured article prepared by the application of heat and pressure to the article of claim 12.

16. A cured article prepreg by the application of heat and pressure to the article of claim 13.

17. A printed circuit board blank comprising an article according to claim 15 clad with a conductive metal.

18. A printed circuit board blank comprising an article according to claim 16 clad with a conductive metal.

19. A printed circuit board blank according to claim 17 wherein the metal is copper.

20. A printed circuit board blank according to claim 18 wherein the metal is copper.

* * * * *